United States Patent
Moeller et al.

(10) Patent No.: US 8,878,074 B2
(45) Date of Patent: Nov. 4, 2014

(54) MULTI-LEVEL CIRCUIT BOARD FOR HIGH-FREQUENCY APPLICATIONS

(75) Inventors: Ulrich Moeller, Holzkirchen (DE); Maik Schaefer, Friedrichshafen-Kluftern (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 59 days.

(21) Appl. No.: 13/819,052

(22) PCT Filed: Aug. 17, 2011

(86) PCT No.: PCT/DE2011/001625
§ 371 (c)(1),
(2), (4) Date: Mar. 12, 2013

(87) PCT Pub. No.: WO2012/025100
PCT Pub. Date: Mar. 1, 2012

(65) Prior Publication Data
US 2014/0083756 A1    Mar. 27, 2014

(30) Foreign Application Priority Data
Aug. 26, 2010 (DE) .......................... 10 2010 035 453

(51) Int. Cl.
*H05K 1/16* (2006.01)
(52) U.S. Cl.
USPC .......................................... 174/260; 174/262
(58) Field of Classification Search
USPC .................. 174/260, 262–266; 361/792–795
See application file for complete search history.

(56) References Cited

U.S. PATENT DOCUMENTS

| 5,248,950 | A | 9/1993 | Horisawa et al. |
|---|---|---|---|
| 5,886,597 | A | 3/1999 | Riad |
| 6,104,258 | A | 8/2000 | Novak |
| 7,183,651 | B1 | 2/2007 | Buhler et al. |
| 8,492,658 | B2 * | 7/2013 | Gruendler et al. ............ 174/262 |
| 2004/0155733 | A1 | 8/2004 | Chen et al. |

(Continued)

FOREIGN PATENT DOCUMENTS

| DE | 100 42 653 | 3/2002 |
|---|---|---|
| DE | 103 47 284 | 5/2005 |
| WO | WO 2008/018875 | 2/2008 |

OTHER PUBLICATIONS

International Search Report of the International Searching Authority for International Application PCT/DE2011/001625, mailed Feb. 14, 2012, 3 pages, European Patent Office, HV Rijswijk, Netherlands.

(Continued)

*Primary Examiner* — Jeremy C Norris
(74) *Attorney, Agent, or Firm* — W. F. Fasse

(57) ABSTRACT

The invention relates to a multi-level circuit board for high-frequency applications with at least one first carrier substrate (PCB1) made of a first material suitable for high frequencies and with at least one second carrier substrate (PCB2,3) made of a second material, which second material has higher dielectric losses than the first material.

At least one signal line structure (S1, C1) is provided on the first carrier substrate (PCB1), and at least one ground layer (M2) connected to electric ground potential is provided on a side of at least one second carrier substrate (PCB2, PCB3), and electrical vias (V) extending through the carrier substrates (PCB1,2,3) are provided.

A capacitance for removing high-frequency power to ground potential is formed through the at least one second carrier substrate (PCB2, PCB3) toward the ground layer (M2, M4), preferably through two carrier substrates made of the second material toward a metallization surface lying therebetween, in that a metallization surface (C3) having a size corresponding to the desired capacitance is formed on that side of the second carrier substrate (PCB2,4) which is opposite the ground layer (M2, M4) and the metallization surface (C3) is connected to the signal line structure (C1) by means of a via (V(C1-C3)).

10 Claims, 2 Drawing Sheets

(56) References Cited

U.S. PATENT DOCUMENTS

2006/0279940 A1    12/2006    Chakravorty et al.
2007/0164396 A1    7/2007    Jow et al.

OTHER PUBLICATIONS

PCT International Preliminary Report on Patentability including English Translation of PCT Written Opinion of the International Searching Authority for International Application PCT/DE2011/001625, issued Feb. 26, 2013, 7 pages, International Bureau of WIPO, Geneva, Switzerland.

German Search Report for German Application No. 10 2010 035 453.8, dated Jul. 8, 2011, 5 pages, Muenchen, Germany, with English translation, 5 pages.

* cited by examiner

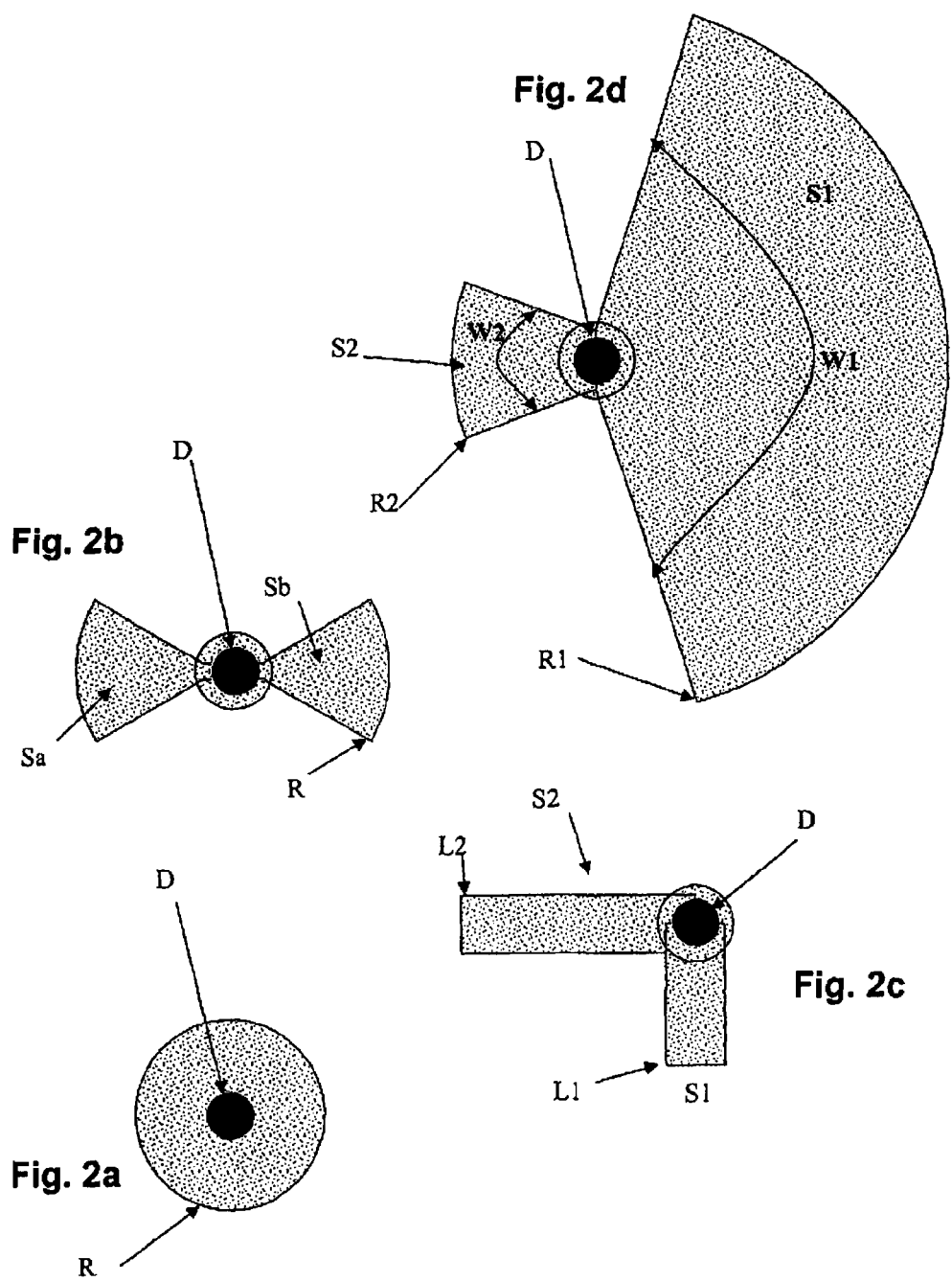

MULTI-LEVEL CIRCUIT BOARD FOR HIGH-FREQUENCY APPLICATIONS

The invention relates to a multi-level circuit board according to the preamble of claim 1. Usually, discrete capacitors for the blocking and filtering of voltages are inserted into printed circuits. Said discrete components have connecting lines with an inductance per unit length. With high-frequency applications, said connecting lines may result in a critical resonance behavior. Moreover, with said frequencies, said components require a lot of space on the surface of the expensive carrier substrate made of a material suitable for high frequencies. The discrete components must be inserted in addition, and the circuit must be protected from EMC disturbances of said components.

Multi-level circuit boards for high-frequency applications are already known in the prior art, wherein such a multi-level circuit board naturally consists of at least one first carrier substrate made of a first material suitable for high frequencies, on which at least parts of the high-frequency circuit are realized. In addition, however, the cost-saving use of at least one second carrier substrate for the power supply and other low-frequency circuit parts is known, which second carrier substrate is made of a second, cheaper material. However, the dielectric losses of said second material are higher than those of the first material. Actually, such multi-level circuit boards made of different carrier substrates are already available commercially.

It is therefore the object of the present invention to provide a suitable multi-level circuit board for high-frequency applications. Said object is achieved by the features of the independent claims. The subclaims reveal advantageous further developments of the invention, wherein combinations and further developments of individual features are also possible.

An essential idea of the invention consists in the fact that the dielectric losses in the second material, which are actually usually disturbing with high-frequency applications, can be specifically used to form a capacitance for draining high-frequency power away. To this end, at least one signal line structure is provided on the first carrier substrate, at least one ground layer connected to electric ground potential is provided on a side of at least one second carrier substrate, and electrical vias extending through the carrier substrates are provided, and the capacitance is formed through at least one second carrier substrate toward the ground layer in that a metallization surface having a size corresponding to the desired capacitance is formed on that side of the second carrier substrate which is opposite the ground layer and the metallization surface is connected to the signal line structure by means of a via.

In a preferred realization, the multi-level circuit board consists of at least three carrier substrates, wherein a first ground layer is provided between the first carrier substrate and the second carrier substrate and a third carrier substrate, which is also made of the second material, is arranged at the second carrier substrate and the metallization surface of the capacitor is formed between the second carrier substrate and the third carrier substrate and a second ground layer is arranged on the opposite side of the third carrier substrate, i.e., the metallization surface of the capacitor is surrounded on both sides by carrier substrates having desired dielectric losses so that it can make optimal use of the size of the metallization surface and better prevent radiation into the first carrier substrate.

In a further preferred realization, the multi-level circuit board has several vias, which are arranged around the metallization surface in a distributed manner and at a predetermined distance from the metallization surface, each of said vias extending from the first ground layer to the second ground layer. Said vias also make the prevention of a lateral radiation of electromagnetic waves from the region of the capacitor into other parts of the carrier substrates made of the second material possible so that they may be readily used for further parts of the circuit.

In the following, the invention will be explained in greater detail on the basis of exemplary embodiments and with the aid of the figures. In the following, identical reference numerals may be assigned to functionally similar and/or similar elements.

BRIEF DESCRIPTION OF THE DRAWINGS

In order that the invention may be clearly understood, it will now be described in connection with example embodiments thereof, with reference to the accompanying drawings, wherein:

FIG. 2a is a plan view of a metallization surface having a complete circle shape around a via;

FIG. 2b is a plan view of a metallization surface shaped as two segments of a circle around a via;

FIG. 2c is a plan view of a metallization surface including two rectangular-shaped parts extending from a via; and FIG. 2d is a plan view of a metallization surface including two parts shaped as circular segments having different radii and different angular sizes.

DETAILED DESCRIPTION OF PREFERRED EXAMPLE EMBODIMENTS OF THE INVENTION

Figure 1:
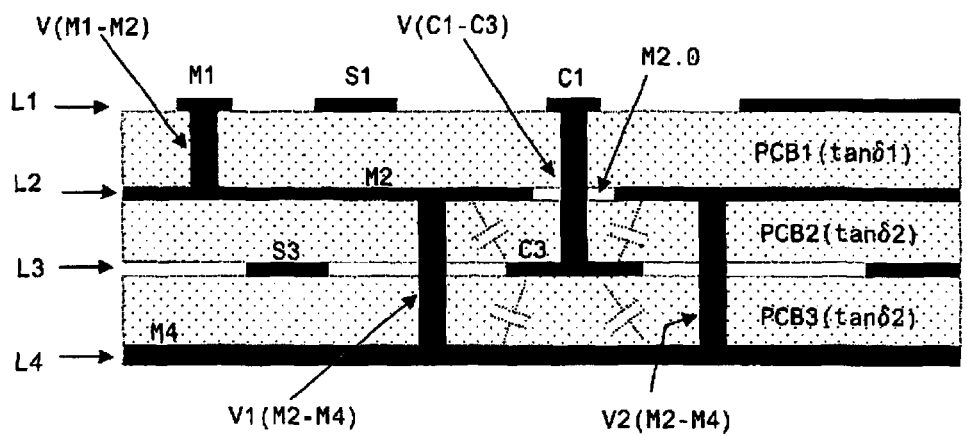
FIG. 1 is a schematic sectional view of an embodiment of a multi-level circuit board according to the invention, having three carrier substrates and four metallization levels.

FIG. 1, which is the particularly preferred realization, shows the multi-level circuit board with three carrier substrates and thus with four metallization levels, wherein the first carrier substrate consists of a first material, which is suitable for high frequencies, and the second and third carrier substrates consist of a material that is cheaper than the first material and has higher dielectric losses. Since a large number of such suitable carrier substrates are indeed available commercially, a selection of materials can be indicated herein as a proposal and exemplary embodiment only, which does not limit the scope of the present application. With a useful-signal frequency given for an application, the dielectric loss angle tan $\delta 2$ of the material of the second/third carrier substrate preferably corresponds at least to the factor 3 of the dielectric loss angle tan $\delta 1$ of the material of the first carrier substrate PCB1, i.e.: tan $\delta 2 > 3 *$ tan $\delta 1$.

However, the dielectric and ohmic losses arising decisively depend on the respective signal frequency and on the respective dielectric loss angle as well as on the selected conductivity so that it is impossible to reasonably indicate the dielectric loss angle as an absolute value. A person having ordinary skill in the art can select the respective suitable materials for the selected application (e.g., 77 GHz for range measurement radar) at any time.

Moreover, the multi-level circuit board has a signal line structure S1, C1 on the first carrier substrate PCB1, and at least one, preferably two, ground layer/s M2, M4 on one side of each of the two second carrier substrates PCB2, PCB3, said ground layer/s being connected to electric ground potential.

A metallization surface C3 having a size and a shape that correspond to the desired capacitance at the application frequency is formed on that side of the second/third carrier substrate PCB2,3 which is opposite the ground layers M2 and M4 (i.e., in metallization level L3), and the metallization surface C3 is connected to the signal line structure C1 by means of a via V(C1-C3).

The capacitance for draining high-frequency power away to reference potential is formed from the metallization surface C3 through the second and third carrier substrates PCB2, PCB3 toward the ground layers M2, M4 (as roughly sketched in the figure already), wherein the poorer (higher) dielectric losses of the cheaper carrier substrate are made use of specifically.

In general, however, the third carrier substrate could be omitted and the metallization surface be arranged in the second metallization level L2 directly between the first and second carrier substrates and the reference ground layer be arranged in the third metallization level already. In such a realization, however, EMC radiation into the first and second carrier substrates would be higher and the size of the metallization surface larger than in the preferred realization shown in the figure.

The multi-level circuit board has at least one via V(M2-M4) extending from the first ground layer M2 toward the second ground layer M4, said at least one via being arranged at a predetermined distance from the metallization surface C3. Particularly preferably, however, several vias V1(M2-M4), V2(M2-M4) are provided, which are arranged around the metallization surface in a spatially distributed manner and at a predetermined distance from the metallization surface C3, each of said vias extending from the first ground layer M2 toward the second ground layer M4. Preferably, said spatial distribution of the vias is an approximately even distribution. Said vias virtually form a Faraday cage around the metallization surface of the capacitor and thus protect the two adjacent carrier substrates from lateral EMC coupling so that further strip conductors S3 can be arranged in the third metallization level.

The size and the shape of the metallization surface of the capacitor define the capacitance. The capacitance defines, together with the inductance per unit length of the connection to the metallization surface C3, a resonant frequency that can be specifically adjusted to the frequency that is required for the application.

Moreover, especially with high-frequency applications, the distance between the outer edge of the metallization surface and the center of the via also influences the attenuation characteristic of the system since a standing wave will virtually develop and attenuation, and thus elimination, will intensify decisively if one attains a distance of at least approximately a ratio of the wavelength of the parasitic frequency to be eliminated that can be expressed by a rational number. Of course, this effect is most intense in the event of exact correspondence. However, the deviations, which are practically hardly avoidable, still allow the effect to be sufficiently good. Therefore, aside from the size of the metallization surface and thus the capacitance thereof, the distance between the outer edge of the metallization surface and the center of the via again defines the effect. First, in FIG. 2a, the metallization surface is a complete circle having a radius R. At the same time, the radius R defines the size of the area.

However, if one uses shapes (see FIG. 2b) that are different from that shown in FIG. 2a, i.e., a segment of a circle (radial stub) or even two such segments of a circle (butterfly stubs), it will be possible, on the one hand, to optimize the distance between the outer edge of the metallization surface and the center of the via specifically for the wavelength of the parasitic frequency/interference wave by means of the radius and, on the other hand, to influence the area and thus the capacitance independently of each other by means of the angle of the segment/s and thus to independently optimize both quantities specifically for the respective application.

Of course, sufficient technical approximation allows the use of other shapes that are just not circular (e.g., rectangular segments). Naturally, with such other shapes, the distance between the outer edge of the metallization surface and the center of the via just does not constantly correspond, in a mathematical sense, to the length of the side face of the rectangle, which is negligible at least if the width B of these rectangular surfaces is sufficiently small, i.e., if the width of the rectangular surfaces is much smaller than the length thereof. However, the exact structuring of such rectangular surfaces (see FIG. 2c) might be much easier than that of segments of a circle, and such rectangular surfaces also enable, on the one hand, the distance between the outer edge of the metallization surface and the center of the via to be optimized specifically for the wavelength of the interference wave and, on the other hand and independently thereof, the capacitance to be defined by adjusting the width of the rectangle. Of course, an intermediate form (e.g., trapezoidal segments with a narrow side at the via and with a surface widening outwardly toward the outer edge of the metallization surface) may be used as well.

However, FIG. 2c shows, aside from the rectangular version of the segments, another, very decisive further development. FIG. 2d shows the same further development and the same functional effect thereof. In each case, the metallization surface C3 consists of two segments S1 and S2 with different distances R1>R2 and L1<L2, respectively. Each of said distances is optimized specifically for a different parasitic frequency to be eliminated, i.e., the presence of two such segments allows the elimination of two different parasitic frequencies by means of one metallization structure by suiting the respective distance R1, R2, L1, L2 between the outer edge of this segment and the center of the via to at least approximately a ratio of the wavelength to these parasitic frequencies f1, f2 that can be expressed by a rational number in each case. The use of even more segments with different distances allows a response to other parasitic frequencies, e.g., the absorption of further harmonics.

The size of these segments, which is defined, e.g., by the angle W1, W2 (segments of a circle) or by the width B1, B2 (rectangles), is adapted to the capacitance that is desired for this parasitic frequency.

Of course, the area around the via is limited and the multitude of different segments with different distances easily sets limits to the availability of a variable width or angle. However, optimization thereof can be performed by appropriate surface shaping.

Of course, it is still possible to provide several segments with identical distances for a particular parasitic frequency, e.g., a butterfly shape (see FIG. 2b), i.e., a shape with four or even more segments.

Moreover, the capacitance and, above all, also the ohmic losses thereof for the purpose of removing interfering energy (or rather, draining interfering energy away), i.e., for the purpose of converting said energy to heat, can be achieved by appropriately selecting the concrete material and the properties of the metallization surface. For example, ohmic loss can be increased by specifically selecting metallization surfaces that are particularly thin (e.g., even thinner than 15 µm with copper surfaces). The desired quality and smoothness of metallization surfaces for normal circuit applications are usually particularly high, whereas an intended generation of said losses can be achieved by selecting a rough metallization surface, thereby further increasing the loss rate.

Nowadays, said measures can be easily optimized at a computer specifically for the respective application by means of appropriate simulation programs. However, only the basic possibilities of influencing can be demonstrated herein and the invention is not limited to a single form or measure.

Such a multi-level circuit board is suitable for high-frequency applications, e.g., for a d.c. power supply filter of an amplifier in the high-frequency range, preferably higher than 1 GHz, in particular also for range measurement radar devices in motor vehicles.

Such an exemplary embodiment is preferably applied at frequencies of higher than 1 GHz.

The invention claimed is:

1. A multi-level circuit board for high-frequency applications
   with at least one first carrier substrate (PCB1) made of a first material suitable for high frequencies, and
   with at least one second carrier substrate (PCB2,3) made of a second material, which second material has higher dielectric losses than the first material,
   as well as with at least one signal line structure (S1, C1) provided on the first carrier substrate (PCB1) and with at least one ground layer (M2) connected to electric ground potential, said at least one ground layer (M2) being provided on a side of at least one second carrier substrate (PCB2, PCB3),
   as well as with electrical vias (V) extending through the carrier substrates (PCB1,2,3), characterized in that
   a capacitance for removing high-frequency power to ground potential is formed through the at least one second carrier substrate (PCB2, PCB3) toward the ground layer (M2, M4) in that a metallization surface (C3) having a size corresponding to the desired capacitance is formed on that side of the second carrier substrate (PCB2,4) which is opposite the ground layer (M2, M4) and the metallization surface (C3) is connected to the signal line structure (C1) by means of a via (V(C1-C3)).

2. The multi-level circuit board according to claim 1, characterized in that
   a first ground layer is provided between the first carrier substrate (PCB1) and the second carrier substrate (PCB2) and a third carrier substrate (PCB3), which is also made of the second material, is arranged at the second carrier substrate (PCB2),
   wherein the metallization surface (C3) of the capacitor is formed between the second carrier substrate (PCB2) and the third carrier substrate (PCB3) and a second ground layer (M4) is arranged on the opposite side of the third carrier substrate (PCB3).

3. The multi-level circuit board according to claim 2, characterized in that at least one via (V(M2-M4)) extending from the first ground layer (M2) toward the second ground layer (M4) is provided, said at least one via (V(M2-M4)) being arranged at a predetermined distance from the metallization surface (C3).

4. The multi-level circuit board according to claim 3, characterized in that at least more than one via (V1(M2-M4), V2(M2-M4)) are provided, which are arranged around the metallization surface (C3) in a distributed manner and at a predetermined distance from the metallization surface (C3), each of said vias (V1(M2-M4), V2(M2-M4)) extending from the first ground layer toward the second ground layer.

5. The multi-level circuit board according to claim 1, characterized in that with a useful-signal frequency given for an application, the dielectric loss angle (tan δ2) of the material of the second carrier substrate (PCB2,3) corresponds at least to the factor 3 of the dielectric loss angle (tan δ1) of the material of the first carrier substrate (PCB1) (tan δ2>3*tan δ1).

6. The multi-level circuit board according to claim 1, characterized in that the capacitance, together with the inductance per unit length of the connection to the metallization surface (C3), is adjusted to a frequency for draining the high-frequency power away, said frequency being specifically required for the application.

7. The multi-level circuit board according to a claim 1, characterized in that the distance (R, R1, R2, L1, L2) between the outer edge of the metallization surface (C3) and the center of the via is defined in such a manner that a ratio of the wavelength to the eliminating parasitic frequency that can be expressed by a rational number is formed at least approximately and the size (W) of the metallization surface (C3) is defined in such a manner that the desired capacitance is reached at least approximately.

8. The multi-level circuit board according to claim 1, characterized in that the metallization surface (C3) consists of at least one non-circular segment (S), preferably a segment of a circle, a trapezoid or a rectangle, wherein the distance (R, L) between the outer edge of the segment and the center of the via is at least approximately formed by a ratio of the wavelength to the eliminating parasitic frequency that can be expressed by a rational number and, on the other hand, the area of the metallization surface (C3), and thus the capacitance thereof, is defined in such a manner that it at least approximately corresponds to the desired capacitance.

9. The multi-level circuit board according to claim 1, characterized in that the metallization surface (C3) consists of at least two segments (S1, S2), wherein at least two of these segments have different distances (R1, R2, L1, L2) between the outer edge and the center of the via and the respective distance (R1, R2, L1, L2) between the outer edge of this segment and the center of the via is suited to at least approximately a ratio of the wavelength of the parasitic frequencies (f1, f2) to be eliminated that can be expressed by a rational number in each case and the size (W1, W2) of this segment of the metallization surface (C3) corresponds to the capacitance that is desired for these parasitic frequencies.

10. Use of a multi-level circuit board according to claim 1 as a d.c. power supply filter of an amplifier in the high-frequency range, preferably higher than 1 GHz, in particular for range measurement radar devices in motor vehicles.

* * * * *